US012728590B2

(12) United States Patent
Guha et al.

(10) Patent No.: US 12,728,590 B2
(45) Date of Patent: Sep. 8, 2026

(54) PRINTHEAD, SYSTEM AND METHOD FOR DIRECT WRITE VAPOR DEPOSITION

(71) Applicant: The University of Chicago, Chicago, IL (US)

(72) Inventors: Supratik Guha, Chicago, IL (US); Pavani Vamsi Krishna Nittala, Westmont, IL (US); Xella A Doi, Chicago, IL (US)

(73) Assignee: THE UNIVERSITY OF CHICAGO, Chicago, IL (US)

( * ) Notice: Subject to any disclaimer, the term of this patent is extended or adjusted under 35 U.S.C. 154(b) by 107 days.

(21) Appl. No.: 18/657,117

(22) Filed: May 7, 2024

(65) Prior Publication Data

US 2024/0375348 A1 Nov. 14, 2024

Related U.S. Application Data

(60) Provisional application No. 63/464,862, filed on May 8, 2023.

(51) Int. Cl.

| | |
|---|---|
| ***B29C 64/159*** | (2017.01) |
| ***B29C 64/209*** | (2017.01) |
| ***B29C 64/232*** | (2017.01) |
| ***B29C 64/245*** | (2017.01) |
| ***B29C 64/255*** | (2017.01) |
| ***B29C 64/295*** | (2017.01) |

(Continued)

(52) U.S. Cl.

CPC .......... *B29C 64/159* (2017.08); *B29C 64/209* (2017.08); *B29C 64/232* (2017.08); *B29C 64/245* (2017.08); *B29C 64/255* (2017.08); *B29C 64/295* (2017.08); *B33Y 10/00* (2014.12); *B33Y 30/00* (2014.12); *C23C 16/01* (2013.01)

(58) Field of Classification Search

CPC ... B29C 64/159; B29C 64/232; B29C 64/245; B29C 64/255; B29C 64/295; B29C 64/209; C23C 16/01

See application file for complete search history.

(56) References Cited

U.S. PATENT DOCUMENTS

2020/0335303 A1 * 10/2020 Gandhiraman ... H01J 37/32009

FOREIGN PATENT DOCUMENTS

EP 1319733 A2 * 6/2003 ............ C23C 16/52

OTHER PUBLICATIONS

Translation of Richardson EP 1319733 A2 accessed on ESpaceNet Jan. 24, 2026 (Year: 2003).*

(Continued)

*Primary Examiner* — Jamel M Nelson
*Assistant Examiner* — Erica Hartsell Funk
(74) *Attorney, Agent, or Firm* — Crowell & Moring LLP

(57) ABSTRACT

A printhead for direct write vapor deposition comprises a nozzle body including a reservoir for holding a material to be printed and a nozzle head protruding from the nozzle body. The nozzle head includes a nozzle opening for ejection of the material as a vapor-phase ink. The nozzle opening is in fluid communication with the reservoir. The nozzle head may protrude from the nozzle body a distance of at least 10 microns. A system for direct write vapor deposition includes the printhead, a heat source positioned to heat the printhead, a substrate in opposition to the nozzle opening for deposition of the vapor-phase ink, and an x-y-z motion stage configured to move the substrate relative to the printhead.

21 Claims, 11 Drawing Sheets

(51) Int. Cl.

| | |
|---|---|
| ***B33Y 10/00*** | (2015.01) |
| ***B33Y 30/00*** | (2015.01) |
| ***C23C 16/01*** | (2006.01) |

(56) References Cited

OTHER PUBLICATIONS

Chen, *Introduction to scanning tunneling microscopy*, 2nd ed., Oxford University Press, Oxford; New York, 2008, front matter.
Holloway, et al., *MRS Proc*. 1990, 204, 409.
Iyer, et al., *IBM J. Res. & Dev*. 2019, 63, 5:1.
Iyer, *MRS Bull*. 2015, 40, 225.
Vazquez-Mena, et al., *Microelectronic Engineering* 2015, 132, 236.
Venables, et al., *In Surface Mobilities on Solid Materials* (Ed.: Binh, V.T.), Plenum Press, New York, 1983, pp. 341-404.
Ayón, et al., *J. Electrochem. Soc*. 1999, 146, 339.
Barth, et al., *J. Mater. Chem. C* 2020, 8, 15884.
Chang, et al., *J. Micromech. Microeng*. 2005, 15, 580.
Chen, et al., *Sci Rep* 2018, 8, 16740.
Cheng, *Proc. IEEE* 1997, 85, 1694.
Datta, *Journal of Micromanufacturing* 2020, 3, 69.
Drahushuk, et al., *Nanoscale* 2019, 11, 2925.
Egerton, et al., *Micron* 2004, 35, 399.
Franssila, *Introduction to microfabrication*, 2nd ed., John Wiley & Sons, Chichester, West Sussex [England], 2010.
Galliker, et al., *Nat Commun* 2012, 3, 890.
Ginger, et al., *Angew. Chem. Int. Ed*. 2004, 43, 30.
Guha, et al., *Future Directions Workshop: Materials, Processes, and R&D Challenges in Microelectronics*, Defense Technical Information Center, 2022.
Imboden, et al., *Nano Lett*. 2013, 13, 3379.
Imboden, et al., *Nanoscale* 2014, 6, 5049.
Iyer, *IEEE Trans. Compon., Packag. Manufact. Technol*. 2016, 6, 973.
Jain, et al., *J. Electrochem. Soc*. 1993, 140, 1434.
Jung, et al., *Nature* 2021, 592, 54.
Kawata, et al., *Nature* 2001, 412, 697.
Kim, et al., *Nature* 2015, 528, 387.
Kuang, et al., *Adv. Mater.* 2014, 26, 6950.
Kundrata, et al., *Small Methods* 2022, 6, 2101546.
Leblanc, et al., *J. Microelectromech. Syst*. 2007, 16, 394.
Lewis, et al., *Materials Today* 2004, 7, 32.
Liu, et al., *Energy Environ. Sci*. 2014, 7, 3223.
Madou, *Fundamentals of microfabrication*, CRC Press, Boca Raton, Fla, 1997.
Manandhar, et al., *Phys. Rev. Lett*. 2003, 90, 115505.
Matsui, et al., *J. Vac. Sci. Technol. B* 2000, 18, 5.
McKinley, et al., *The Journal of Chemical Physics* 1954, 22, 1120.
Ohring, *The materials science of thin films*, Academic Press, Boston, 1992.
Park, et al., *Advanced Science* 2022, 9, 2104623.
Park, et al., *Nature Mater* 2007, 6, 782.
Pascale, et al., *Applied Physics Letters* 2023, 122, 100501.
Piner, et al., *Science* 1999, 283, 661.
Plank, et al., *Micromachines* 2019, 11, 48.
Plimpton, et al., *Physics of Fluids* 2019, 31, 086101.
Rangelow, et al., *J. Vac. Sci. Technol. B* 2001, 19, 2723.
Savu, et al., *J. Vac. Sci. Technol. B* 2008, 26, 2054.
Seniutinas, et al., *Nanophotonics* 2017, 6, 923.
Shtein, et al., *Adv. Mater*. 2004, 16, 1615.
Späth, *Micromachines* 2019, 10, 834.
Uppuluri, et al., *Opt. Express* 2010, 18, 7369.
Utke, et al., *Journal of Vacuum Science & Technology B: Microelectronics and Nanometer Structures Processing, Measurement, and Phenomena* 2008, 26, 1197.
Vettiger, et al., *IBM J. Res. & Dev*. 2000, 44, 323.
Waller, et al., *Micromachines* 2019, 10, 827.
Wong, et al., *ISRN Mechanical Engineering* 2012, 2012, 1.
Woodruff, *Phil. Trans. R. Soc. A*. 2015, 373, 20140230.
Zhang, et al., In *2009 International Conference on Electronic Packaging Technology & High Density Packaging*, IEEE, Beijing, China, 2009, pp. 497-503.
Zhang, et al., *Science* 1997, 276, 377.
Zimmermann, et al., *Thin Solid Films* 1989, 175, 85.

* cited by examiner

PRINTHEAD, SYSTEM AND METHOD FOR DIRECT WRITE VAPOR DEPOSITION

RELATED APPLICATIONS

The present patent document claims the benefit of priority to U.S. Provisional Patent Application No. 63/464,862, which was filed on May 8, 2023, and is hereby incorporated by reference in its entirety.

TECHNICAL FIELD

This disclosure relates generally to direct write fabrication and more particularly to a printhead, system and method for direct write vapor deposition.

BACKGROUND

There is growing interest today in the microelectronics industry for creating three-dimensional (3D) chip architectures and in the heterogeneous integration (HI) of components. This has led to the need for alternatives to two-dimensional lithography-based nanofabrication, which was originally developed to meet the needs of planar chip technologies. Recently, there has been interest in additive "direct write" approaches as an alternative method of nanofabrication with two significant opportunities for their utilization.

The first opportunity is in HI: creating dense interconnects between many chiplets with diverse functions and geometries that are integrated on large panels or packages, often organic substrates. Chiplet integration addresses the needs for energy efficient computing and the need for fast access to lots of memory. The area of a single chip is ultimately limited by the reticle (mask) size during lithography, hence the integration of multiple chiplets is necessary. There is an opportunity in HI for a monolithic, preferably 3D compatible, fabrication process for creating interconnects and associated passive device components (such as inductors and capacitors) on a panel. The reticle size limitation and need for diverse substrates represent an opportunity for new direct write methods. The specifications for direct write methods for this application would be resolutions from the nanoscale (~100 nm) to micron range, high deposition speeds, ability to deposit ultrapure metals and dielectrics, and 3D compatibility.

The second opportunity for direct write is in augmenting conventional lithography to create features in the front end or back end of a chip that are more amenable to 3D structures. This may require feature size control in the 1 nm to 10 nm range. The creation of modern 3D device architectures by traditional lithography-based nanofabrication requires many process steps. Additive manufacturing via direct write methods is inherently three-dimensional, so it may overcome these limitations and simplify processing.

Direct write-based additive manufacturing on the macroscopic scale is widely used for prototyping and commercial products. In nanofabrication, focused ion beam (FIBID) and focused electron beam (FEBID) induced depositions have been available for direct writing at the nanoscale, and are able to perform both material addition and subtraction, and features of sub-20 nm dimensions have been demonstrated. However, challenges remain due to scalability, beam damage and contamination, and compatibility with insulating substrates. Direct write research has also included methods utilizing liquid-phase precursors and methods including inkjet printing, extrusion, and photocuring. Many of these approaches face the challenge of developing unique inks or precursors suitable for the deposition of ultra-high purity materials with high uniformity.

BRIEF SUMMARY

A printhead for direct write vapor deposition comprises a nozzle body including a reservoir for holding a material to be printed and a nozzle head protruding from the nozzle body. The nozzle head includes a nozzle opening for ejection of the material as a vapor-phase ink. The nozzle opening is in fluid communication with the reservoir. The nozzle head protrudes from the nozzle body a distance of at least 10 microns.

A system for direct write vapor deposition includes: (a) a printhead comprising: a nozzle body including a reservoir for holding a material to be printed; and a nozzle head protruding from the nozzle body, the nozzle head including a nozzle opening for ejection of the material as a vapor-phase ink, where the nozzle opening is in fluid communication with the reservoir; (b) a heat source positioned to heat the printhead; (c) a substrate in opposition to the nozzle opening for deposition of the vapor-phase ink, and (d) an x-y-z motion stage configured to move the substrate relative to the printhead.

A method for direct write vapor deposition includes providing a printhead that comprises (a) a nozzle body having a reservoir configured to hold a material to be printed and (b) a nozzle head protruding from the nozzle body and including a nozzle opening in fluid communication with the reservoir. The method further includes delivering the material to be printed into the reservoir, and heating the printhead to a temperature sufficient to evaporate the material or to maintain the material in a gaseous state. Consequently, a vapor-phase ink is formed and exits the printhead through the nozzle opening. During the heating, a substrate positioned in opposition to the nozzle opening is moved relative to the printhead. After exiting the printhead, the vapor-phase ink contacts the substrate and is deposited as a solid material in a pattern determined by the relative motion of the printhead and the substrate.

BRIEF DESCRIPTION OF THE DRAWINGS

The embodiments may be better understood with reference to the following drawings and description. The components in the figures are not necessarily to scale. Moreover, in the figures, like-referenced numerals designate corresponding parts throughout the different views.

FIGS. 7A-1 to 7A-3 are SEM images documenting the reduction of nozzle opening size post-fabrication using plasma enhanced chemical vapor deposition (PECVD) and atomic layer deposition (ALD).

FIGS. 7B-1 and 7B-2 are SEM images documenting the reduction of nozzle opening size post-fabrication using ALD.

FIG. 7C is an SEM image showing a cross-section view of the sample shown in FIG. 7A-3.

FIGS. 8A to 8D are optical images showing static deposition of various materials.

FIGS. 9A to 9C include SEM and atomic force microscope (AFM) images showing the geometry of lines formed by direct write vapor deposition and a plot of height of the deposited material versus distance from the center of the line.

DETAILED DESCRIPTION

Described herein is a new deposition method referred to as direct write vapor deposition that can enable one-step three-dimensional maskless nanofabrication on a variety of substrates. A printhead has been developed which allows gaseous inks to exit a nozzle head through a nanoscale nozzle opening while held at a controlled distance from a substrate by a three-axis nanopositioning stage. As the gaseous ink condenses on a localized region of the substrate, movement of the nozzle head relative to the substrate may allow for the production of direct-write patterns. Heating of the entire printhead during use may prevent nozzle clogging so that the nozzle head may be used indefinitely without cleaning. The performance of the printhead, which may in some examples be referred to as a microevaporator, has been tested by creating localized depositions of various materials, and line writing potential has been demonstrated. The printhead is described in detail below along with a system and method for direct write vapor deposition that can be used to produce patterns of metals, dielectrics, polymers, organic compounds and other materials.

Figure 1:
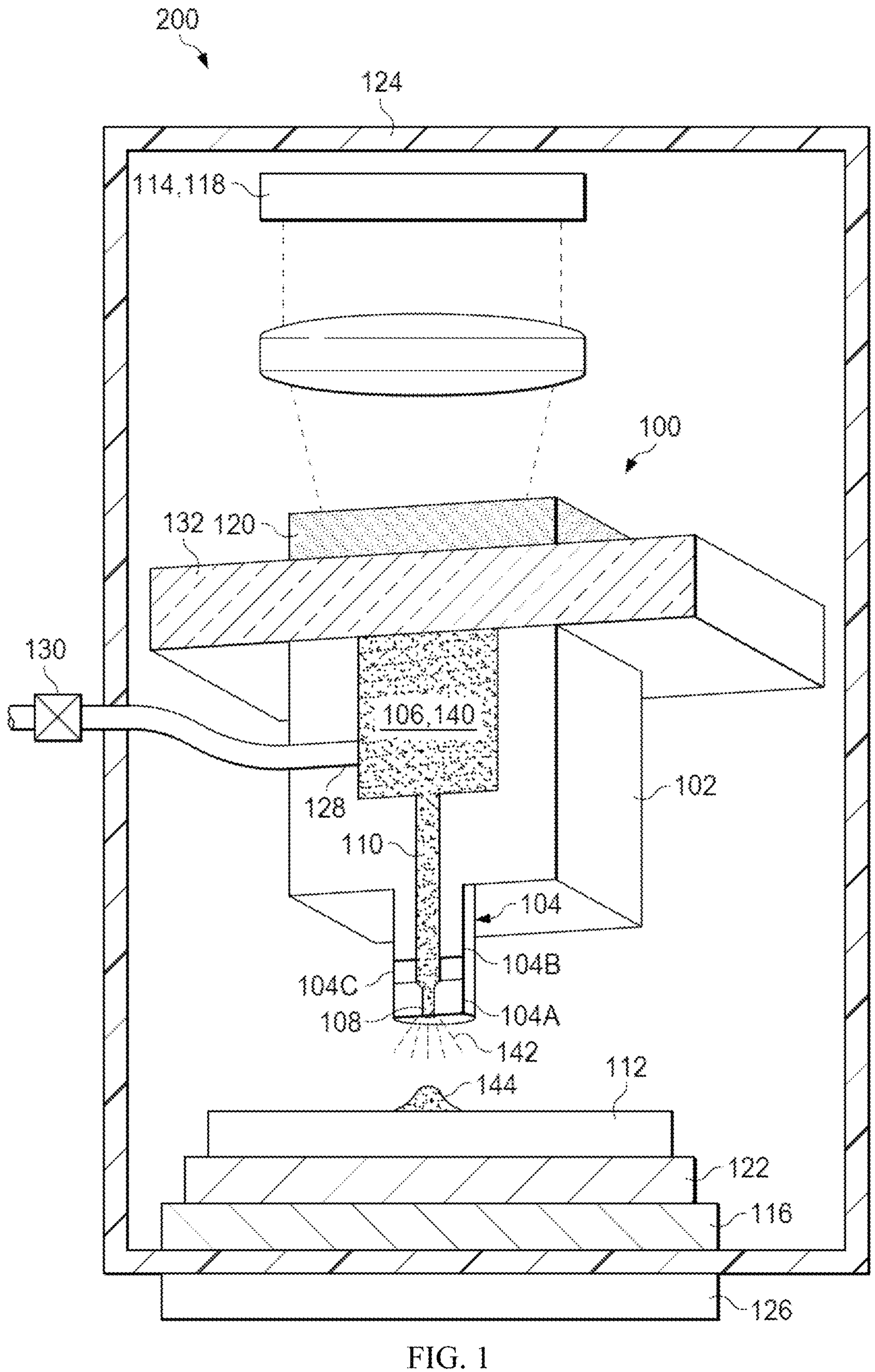
FIG. 1 is a schematic of an exemplary printhead and system for direct write vapor deposition, with associated scanning electron microscope (SEM) images (insets).

Referring to FIG. 1, the printhead 100 comprises a nozzle body 102 including a reservoir 106 for holding a material to be printed, and a nozzle head 104 protruding from the nozzle body 102. The nozzle head 104 includes a nozzle opening 108 for ejection of the material as a vapor-phase ink. Accordingly, the nozzle opening 108 is in fluid communication with the reservoir 106; that is, the nozzle opening 108 and the reservoir 106 are directly or indirectly connected such that fluid (e.g., a vapor-phase ink) can flow between them. Due to the flow direction during printing, the reservoir 106 may be described as being upstream of the nozzle opening 108. As will be further discussed below, the material to be printed may comprise a solid-phase, liquid-phase or gas-phase material that, at the temperature employed for printing, can produce the vapor-phase ink (e.g., due to boiling, evaporation, a high vapor pressure, and/or already being in a gaseous state). The reservoir 106 and the nozzle opening 108 may be connected by a channel 110 sized to accommodate flow of the vapor-phase ink. The channel 110 may have a width or diameter larger than that of the nozzle opening 108 and smaller than that of the reservoir 106. As shown in FIG. 1, the channel 110 may originate in the nozzle body 102 and terminate in the nozzle head 104. The nozzle head 104 may extend away from the nozzle body 102 a distance of at least 10 microns to avoid unintended heating (e.g., of an opposing substrate 112) due to near-field radiative heat transfer effects. Typically, the nozzle head 104 protrudes from, or extends away from, the nozzle body 102 a distance in a range from 10 microns to 100 microns, and the distance may be as high as 500 microns. The nozzle opening 108 may have a width or diameter in a range from 30 nm to 2 microns to allow micro- and nanoscale line widths to be obtained during printing. Using advanced etching techniques, it is postulated that the nozzle opening 108 may be produced with a width or diameter as small as 5 nm, while larger nozzle openings (e.g., up to 100 microns in width or diameter) may be produced for mesoscale printing applications. In some examples, the width or diameter may be in the range from 30 nm to 700 nm, or in the range from 100 nm to 500 nm.

The printhead 100 may be fabricated from a semiconductor wafer. In some examples, the semiconductor wafer may be a silicon-on-insulator (SOI) wafer. Accordingly, lithography and etching methods capable of producing high aspect ratio features having micro- and/or nanoscale dimensions may be employed for fabrication of the printhead 100, as described below. When constructed from a silicon-on-insulator wafer, the nozzle head 104 may further include a first wall portion 104*a* defining the nozzle opening 108, a second wall portion 104*b* defining a terminating part of the channel 110, and a third wall portion 104*c* at a transition region between the first and second wall portions 104*a*, 104*b*, where the first wall portion 104*a* comprises a first patterned silicon layer aligned substantially normal to the nozzle opening 108, the second wall portion 104*b* comprises a second patterned silicon layer aligned substantially normal to the channel 110, and the third wall portion 104*c* comprises a patterned silicon dioxide layer between the first and second patterned silicon layers.

The channel 110 may have a width or diameter in a range from 5 microns to 100 microns, and an aspect ratio of the channel 110 may be in a range from 1:13 to 1:30. The reservoir 106 has a relatively large volume to ensure that a sufficient amount of material for printing may be contained in the reservoir 106. Accordingly, the reservoir 106 may have a width or diameter in a range from 100 microns to about 5000 microns. The reservoir 106, channel 110 and nozzle opening 108 each may have a transverse cross-section of any desired shape, such as a circle, oval, square, triangle, rectangle, pentagon, hexagon, octagon or other polygon.

Figures 2A, 2B, 2C:
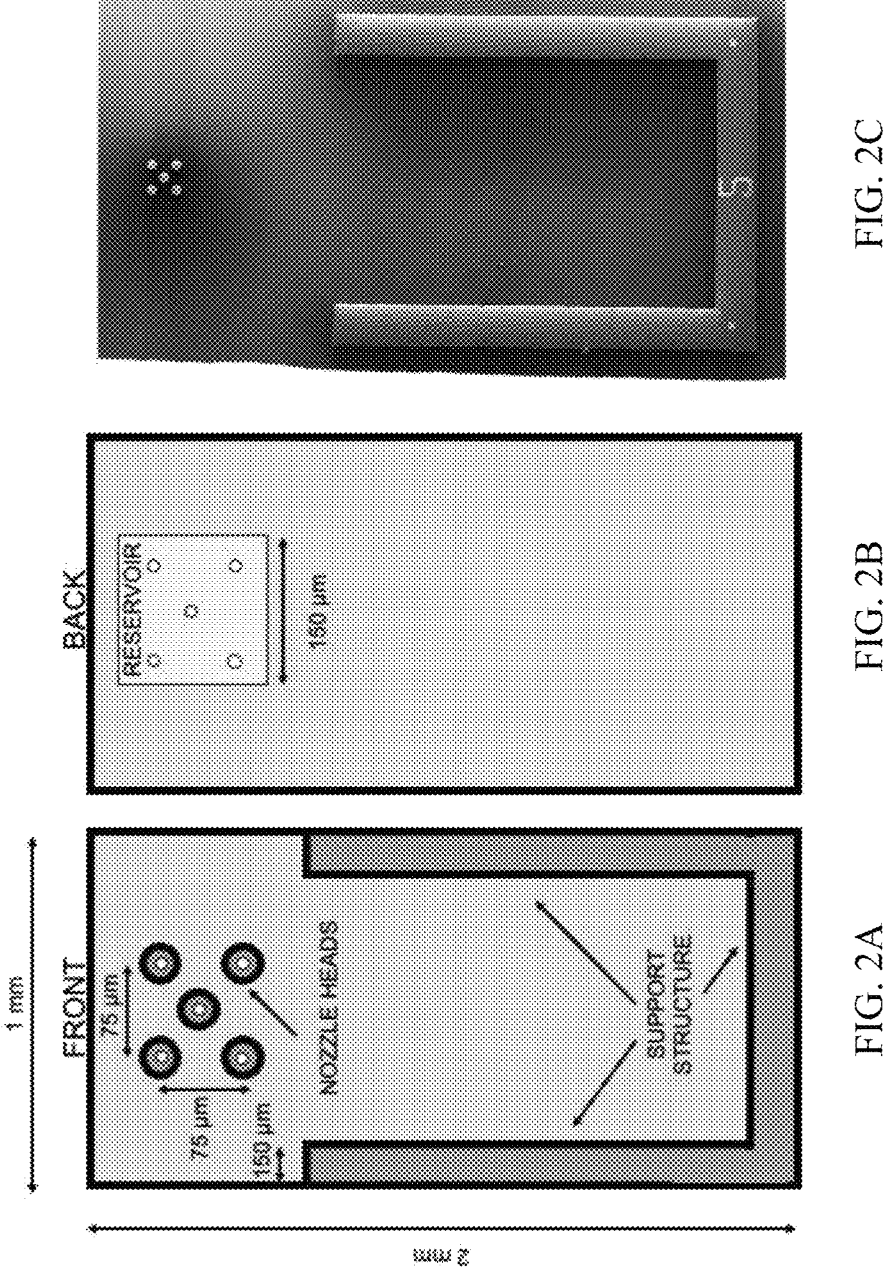
FIG. 2A is a front-view schematic of an exemplary printhead having multiple nozzle heads and nozzle openings.
FIG. 2B shows a back-view schematic of the printhead.
FIG. 2C shows a front-view SEM image of an actual fabricated printhead.
Figures 3A, 3B:
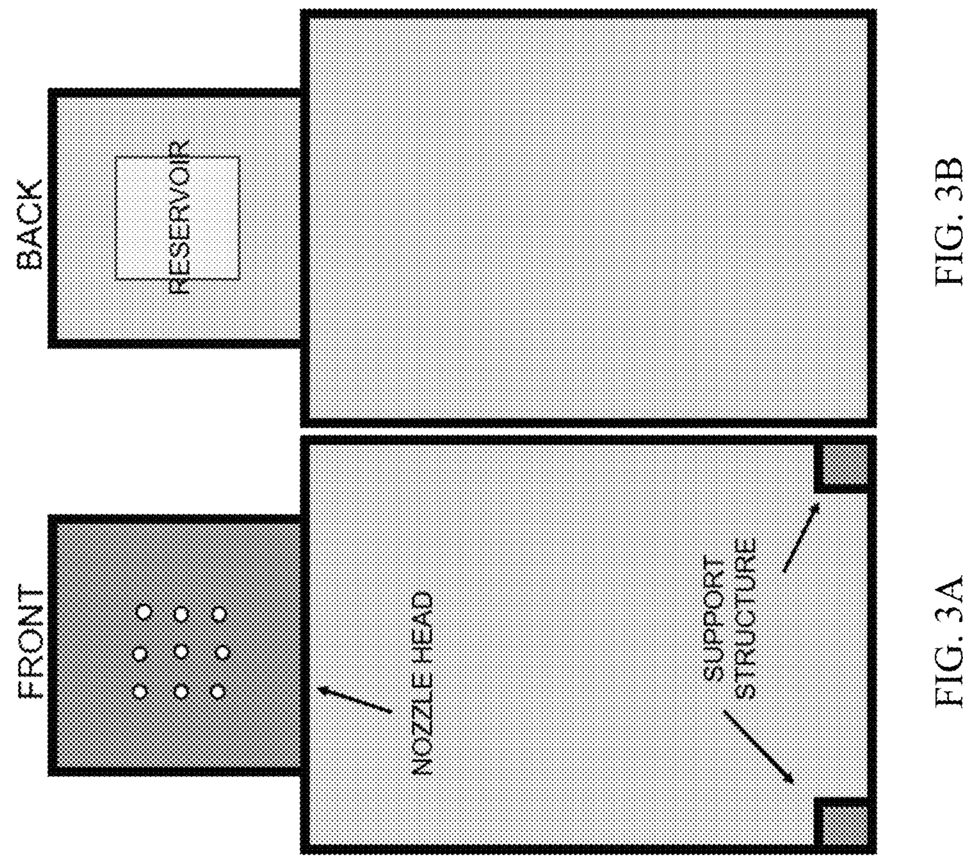
FIGS. 3A and 3B show front- and back-view schematics of an exemplary printhead having a single nozzle head with a multiple nozzle openings.

Referring now to FIGS. 2A-2C, the printhead 100 may include a plurality of the nozzle heads 104 and the nozzle openings 108 in fluid communication with the reservoir 106. FIG. 2A shows a front-view schematic of the printhead, FIG. 2B shows a back-view schematic of the printhead, and FIG. 2C shows a front-view SEM image of a fabricated printhead. For example, the printhead 100 may include at least 2, at least 4, at least 8, or at least 16 nozzle heads 104, and/or up to 20 nozzle heads 104 (with the associated nozzle openings 108). Alternatively, referring to the front- and back-view schematics of FIGS. 3A and 3B, the printhead 100 may include multiple nozzle openings 108 on a single nozzle head 104. For example, from 2 to 20 nozzle openings 108 may be fabricated on a single nozzle head. In this example, the width or diameter of the nozzle head 104 may be the same as or comparable to that of the nozzle body 102. In other examples, the printhead 100 may include a plurality of the reservoirs 106, where each reservoir 106 is in fluid communication with a single nozzle opening 108 or with multiple nozzle openings 108, as shown in the front-view and back-view schematics of FIGS. 4A and 4Bs. For example, the printhead may include at least 2, at least 4, and/or up to 8 reservoirs 106, with the number of nozzle heads 104 and nozzle openings 108 being as indicated above.

Referring again to FIG. 1, a system 200 for direct write vapor deposition includes the printhead 100 described above, a heat source 114 positioned to heat the printhead 100, a substrate 112 in opposition to the nozzle opening 108 for deposition of the vapor-phase ink, and an x-y-z motion stage 116 configured to move the substrate 112 relative to the printhead 100. In other words, the motion stage 116 may be configured to move one or both of the substrate 112 and the printhead 100 during printing, and thus the motion stage 116 may be operably connected to the printhead 100, the substrate 112, or both the printhead 100 and the substrate 112. The heat source 114 may comprise, as shown in FIG. 1, a light emitting diode 118 configured to impinge light upon a light-absorbing conductive material 120 (e.g., black silicon) positioned in thermal contact with the nozzle body 102. That is, the light-absorbing conductive material 120 may be in direct contact with or in close proximity to the nozzle body 102, such that heat is transferred from the light-absorbing conductive material 120 to the nozzle body 102. In other examples, the heat source 114 may comprise a resistive heater, a laser, or other heating device positioned as needed to heat the printhead 100 and/or the material to be printed. Depending on whether a physical or chemical vapor deposition process is being carried out, as discussed below, the substrate 112 may be either heated or cooled, e.g., by being placed in thermal contact with either a heating or cooling device 122. The system 200 may be enclosed in a vacuum chamber 124 for operation, and the vacuum chamber 124 may be mounted on a pneumatic vibration isolation table 126 to ensure printing fidelity. The system may further include an inlet 128 to the nozzle body 102 for delivery of the material to be printed into the reservoir 106, e.g., when the material is a gas-phase or liquid-phase material. In such an example, a mass flow controller 130 may be operably connected to the inlet 128 to control the flow rate of the gas- or liquid-phase material into the reservoir 106.

Figure 5A:
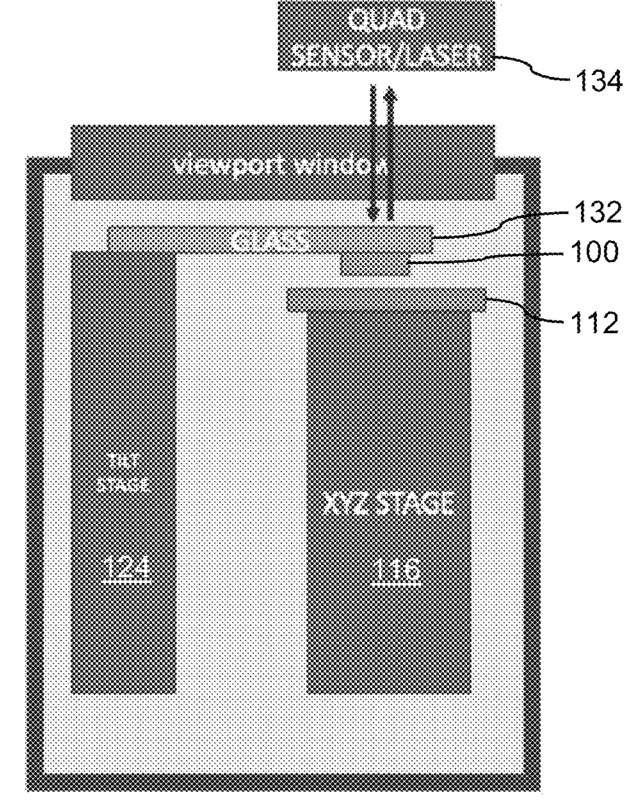
FIGS. 5A and 5B illustrate an exemplary tilt stage (FIG. 5A) for reducing tilt between the printhead and the substrate (FIG. 5B).
Figure 5B:
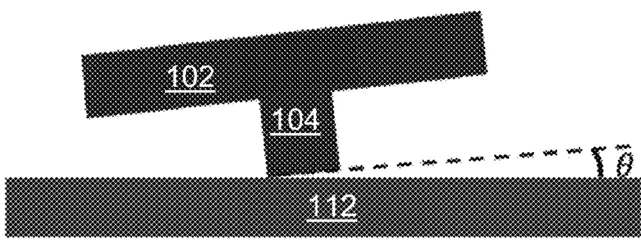

The system 200 may further include a tilt stage 124, as shown in the schematics of FIGS. 5A and 5B, configured to align the nozzle opening 108 with the substrate 112 prior to printing. The problem of positioning an atomically sharp scanning probe within nanometers of a substrate is not new, but the alignment problem becomes much more challenging when the atomically sharp probe tip is replaced with a flat surface of a finite area, as is the case with the nozzle head 104 employed in this technology. Here, a small relative tilt (θ) between the surface of the nozzle head 104 and the surface of the substrate 112, as illustrated in FIG. 5B, may limit the minimum distance of the nozzle opening 108 (which may be centered on surface of the nozzle head 104) to the substrate 112. To limit this effect, in addition to designing the printhead 100 with a narrow nozzle head 104 extending away from the wider nozzle body 102, a back surface of the printhead 100 (e.g., the glass slide 132 shown in FIGS. 1 and 5A) may be manually aligned to be parallel with the surface of the substrate 112 prior to printing, e.g., using a laser 134. An exemplary alignment procedure is described below.

Control over (a) the size of the nozzle opening 108 and (b) the distance between the nozzle opening 108 and the substrate 112 may allow for good resolution (e.g., fine line widths) during printing. The width or diameter of the nozzle opening 108 may vary over a large range as indicated below (e.g., from 5 nm to 100 microns) depending on the printing application and fabrication method, but is more typically in a range from about 30 nm to about 700 nm. Ideally, the distance between the substrate 112 and the nozzle opening 108 may be controlled to be within +/−30% of the width or diameter of the nozzle opening 108, or within +/−10%.

Now that the printhead 100 and system 200 have been described, a method of direct write vapor deposition is explained in reference to FIG. 1. The method includes providing a printhead 100 comprising (a) a nozzle body 102 including a reservoir 106 configured to hold a material to be printed and (b) a nozzle head 104 projecting from the nozzle body 102 and including a nozzle opening 108 in fluid communication with the reservoir, as shown in FIG. 1. The material 140 to be printed, which may comprise a solid-phase, liquid-phase, or gas-phase material or precursor, is introduced or delivered into the reservoir 106. The printhead 100 is heated to a temperature sufficient to evaporate the material 140 or to maintain the material 140 in a gaseous state, and thus a vapor-phase ink 142 is formed and exits the printhead 100 through the nozzle opening 108. A temperature sufficient to evaporate the material 140 may be understood to be high enough to heat the material 140 to its boiling point or to achieve a sufficient vapor pressure from the material 140 in the solid- or liquid-phase to form the vapor-phase ink 142. During the heating, a substrate 112 positioned in opposition to the nozzle opening 108 is moved relative to the printhead 100. In other words, the substrate 112 may be moved, the printhead 100 may be moved, or both the substrate 112 and the printhead 100 may be moved. After exiting the printhead 100 through the nozzle opening 108, the vapor-phase ink 142 contacts the substrate and is deposited as a solid material 144 in a pattern determined by the relative motion of the printhead 100 and the substrate 112. The movement of the substrate 112 relative to the printhead 100 may take place at a translation rate of at least about 0.1 nanometers per second, and as high as about 10 microns per second.

In a physical vapor deposition (PVD) implementation of the method, the vapor-phase ink 142, which is formed by evaporation from the material 140 to be printed, condenses upon contacting the substrate 112. Accordingly, the substrate 112 may be cooled to a temperature below ambient temperature (e.g., 18-25° C.) to promote condensation. For example, the substrate 112 may be in thermal contact with a liquid nitrogen-cooled surface or other cooling source 122 (e.g., a cold finger). Introducing the solid-phase material to be evaporated into the reservoir 106 may entail loading the reservoir 106 with a powder, pellets, granules or another form of the solid-phase material prior to printing. Alternatively, the solid-phase material may be heated to its melting point and delivered into the reservoir as a liquid-phase material via an inlet 128 to the nozzle body 102, prior to and/or during printing. Suitable materials for printing may include those that may be deposited as films using conventional thermal evaporation-based PVD, such as metals, preferably high-vapor pressure metals, and polymers.

In a chemical vapor deposition (CVD) implementation of the method, the material 140 to be printed may comprise a gaseous or volatile liquid precursor that can be delivered into the reservoir prior to and/or during printing via the inlet 128 to the nozzle body 102. In either the PVD or CVD implementation of the method, the material 140 to be printed may be delivered into the reservoir 106 continuously while the printhead 100 is being heated. The vapor-phase ink 142 formed from the gaseous or volatile liquid precursor exits the nozzle opening 108 and chemically reacts and/or decomposes upon contacting the substrate 112. The substrate may be heated to a temperature sufficient to promote the reactions needed to form the desired solid material from the vapor-phase ink. For example, the substrate may be placed in thermal contact with a resistively heated plate (e.g., a hot plate). The deposited solid material 144 may comprise a metal, semiconductor, or a dielectric, e.g., aluminum, copper, gold, platinum, indium-tin oxide, aluminum oxide, hafnium oxide, silicon dioxide, titanium nitride, silicon nitride, silicon oxynitride, and silicon carbide, to name a few examples. Precursors known in the art to produce the desired solid material may be employed as the gaseous or volatile liquid precursor, e.g., $SiH_4$ and $NH_3$ may be employed to deposit silicon nitride, and it is understood that the term "gaseous or volatile liquid precursor" may refer to a single precursor or to multiple precursors. As in conventional CVD processes, a carrier gas may be delivered into the reservoir along with the gaseous or volatile liquid precursor, such that the vapor-phase ink further includes the carrier gas. In some examples, printing may be carried out in a reactive environment including a gaseous reactant selected to chemically react with the vapor-phase ink upon ejection from the nozzle opening, thereby influencing the composition of the material deposited on the substrate.

The heating of the printhead 100 may be achieved by any heating method known in the art that allows for controlled and preferably uniform heating of the printhead 100 and the material 140 contained in the reservoir 106. By keeping the printhead 100 hot, clogging of the nozzle opening 108 (e.g., by premature condensation of the vapor-phase ink) may be avoided. A minimum temperature to which the printhead 100 is heated may be determined based on the material 140 to be printed, e.g., at what temperature the material 140 has a sufficient vapor pressure for printing. A maximum temperature to which the printhead 100 is heated may be less than a temperature at which the printhead 100 (which may be fabricated from a Si or SOI wafer) may melt or decompose due to the heating. It may be beneficial to control the temperature to which the nozzle body 102 is heated to manipulate the flow rate of the vapor-phase ink 142 through the nozzle opening 108, where higher flow rates may be achieved at higher temperatures, for example. The heating may utilize the configuration shown in FIG. 1, where a light emitting diode 118 impinges light upon a light-absorbing conductive material 120 positioned adjacent to or in close proximity with the nozzle body 102, or may entail another method, such as laser heating or resistive heating.

As is typical in PVD and CVD processes, the direct write vapor deposition method may be carried out under vacuum (sub-atmospheric pressure) conditions, typically in a vacuum chamber 124, as illustrated in FIG. 1. For example, a base pressure in the vacuum chamber 124 may be about $1\times10^{-7}$ kPa or less. In some examples, an inert gas environment at sub-atmospheric pressure may be employed. Also or alternatively, the controlled environment may include a gaseous reactant selected to chemically react with the vapor-phase ink 142 upon ejection from the nozzle opening 108, as indicated above, thereby influencing the composition of the solid material 144 deposited on the substrate 112. It is also postulated that the method may be carried out at atmospheric pressure in some examples due to the short distance between the nozzle opening 108 and the substrate 112.

Figure 4B:
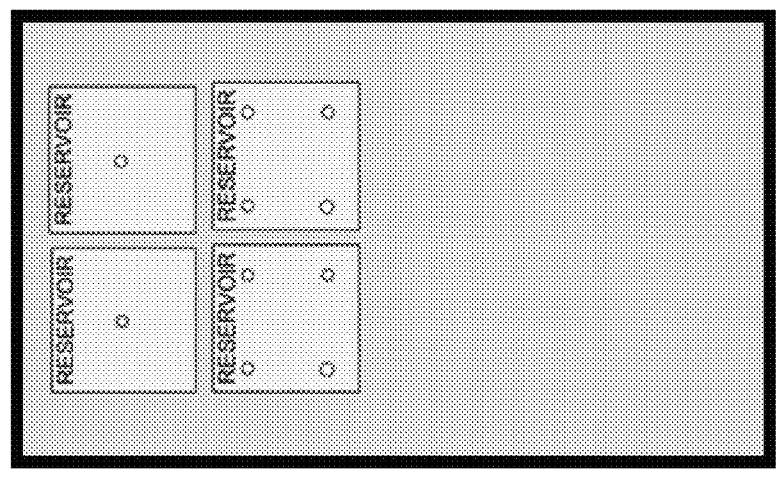
FIGS. 4A and 4B show front- and back-view schematics of an exemplary printhead having multiple nozzle heads and nozzle openings and also multiple reservoirs, where each reservoir is in fluid communication with either one nozzle opening or with multiple (four, in this example) nozzle openings.
Figure 4A:
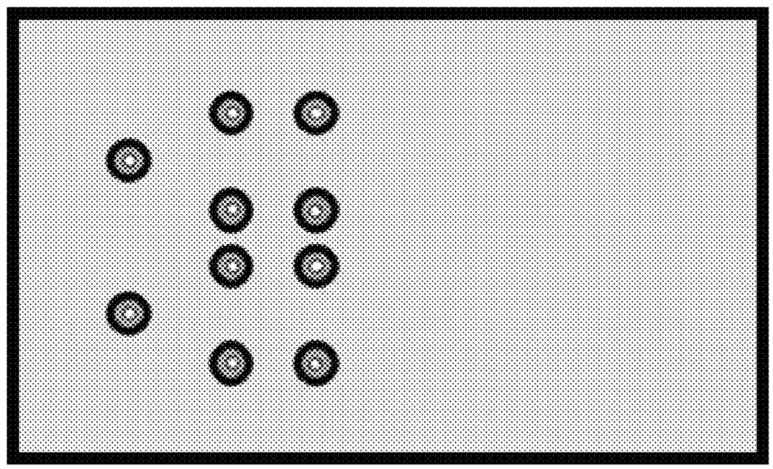

As shown in FIGS. 2A-4B, the printhead 100 may be configured with a plurality of reservoirs 106 and/or a plurality of nozzle openings 108. Accordingly, during heating, the vapor-phase ink 142 may exit the printhead 100 from multiple nozzle openings 108. That is, the same vapor-phase ink 142 may exit multiple nozzle openings 108 and allow for parallel and thus faster deposition. Alternatively, different vapor-phase inks 142 may exit the multiple nozzle openings 108, such as when the printhead 100 includes multiple reservoirs 106, as shown in FIG. 4B, that each contain a different material to be printed. This may allow for parallel printing of different vapor-phase inks and/or mixing of vapor-phase inks upon ejection from the nozzle openings 108.

Prior to heating the nozzle head 104 to commence printing, the printhead 100 may be aligned such that a surface of the nozzle head 104 facing the substrate 112 is parallel or substantially parallel with the substrate 112. As discussed in detail below in reference to FIGS. 5A and 5B, the alignment may be carried out by impinging a laser on a light-reflective surface of the printhead 100, and making any position adjustments based on information from the laser impingement.

EXAMPLES

Described in this section is the design and fabrication of an exemplary printhead as well as a route to fabricating nozzle openings as small as 30 nm in diameter. Printhead loading, deployment, and heating is discussed along with initial demonstrations of deposition capability. Localized thin film depositions grown by this method are compared with direct simulation Monte Carlo (DSMC) simulations and calculations based on Knudsen's cosine equation to use the expected shape of deposited material to approximate the source to substrate distance during deposition.

Exemplary System for Direct Write Vapor Deposition

Referring again to FIG. 1, a printhead 100 fabricated from a silicon wafer is positioned above a substrate 112 and heated to cause a material 140 to be printed to evaporate and form a vapor-phase ink 142, which then exits the nozzle opening 108 and condenses on the substrate 112. The printhead 100 of this example includes a 150 μm wide reservoir 106 connected to a 10 μm-diameter channel 110 (or through-silicon via (TSV)) that terminates in a nozzle opening of 2 μm to 300 nm in diameter that emits the vapor-phase ink in a localized area.

By integrating the reservoir 106 and the nozzle head 104 onto a single 1 mm by 2 mm chip, it was possible to fabricate a simple, self-contained printhead 100 for performing direct write vapor deposition. The printhead 100 is used for PVD by filling the reservoir 106 with solid material 140 and sealing, then heating the entire device to cause the material 140 to evaporate and exit via the nozzle opening 108. In this exemplary system, light from an LED 118 is focused on a black silicon chip 120, which conducts heat through the glass slide 132 to the printhead 100, resulting in heating of the material 140 in the reservoir 106. It is beneficial that the material to be printed 140 has a grain size or physical form much larger than the size of the channel 110 and nozzle opening 108 so the material 140 remains contained inside the reservoir 106 until it is evaporated. Coupled with a three-axis nanopositioning stage 116, the printhead 100, in particular the nozzle opening 108, is held at distances from the substrate 112 comparable to the diameter of the nozzle opening (e.g., ~20 μm to 500 nm) 108 to create localized depositions. The nozzle opening 108 is centered on a 30 μm-across nozzle head 104 which allows for precise positioning and reduced thermal interaction between the printhead 100 and substrate 112. The printhead 100 is scanned relative to the substrate 112 to write patterns. The substrate 112 may be placed on a copper heat sink for thermal stability and can be further cooled by a liquid nitrogen cold finger. The entire system 200 is housed in a vacuum chamber 124 (e.g., $10^{-7}$ kPa or lower base pressure) that is mounted on a pneumatic vibration isolation table 126.

In designing this exemplary system, several factors that influence the writing properties were identified: nozzle (opening) size, approach distance, and thermal interactions. In the following, all three of these factors are addressed with the goal of minimizing the achievable linewidth of the deposition. To minimize the size of the nozzle opening 108, a nanofabrication process based on electron beam lithography (EBL), time-multiplexed "Bosch" etching, and a nozzle diameter trimming approach is utilized to produce nozzle openings 108 of 300 nm in diameter in this work, and the approach may be used to produce nozzle openings 108 as small as 30 nm.

To minimize approach distance, the printhead geometry is chosen such that the nozzle placement on a 30 μm-diameter nozzle head 104 allows for close approach even with some angular mismatch between the printhead 100 and the substrate 112. A nanopositioning stage 116 and laser alignment technique are also implemented with the goal of minimizing approach distance. The nozzle head geometry also reduces the thermal interaction between source and substrate 112 since it minimizes the area of the printhead 100 which is within the "near-field" distance for thermal coupling. The thermal interactions in the system are dependent on the printhead to substrate distance and the use of temperature measurements is proposed as a method for controlling this distance.

Printhead Fabrication

The overall design of the fabricated printhead can be seen in the schematics and SEM image of FIGS. 2A-2C. The basic geometry includes a reservoir for the material to be evaporated to form a vapor-phase ink that flows through a nozzle opening at the end of a pillar-shaped nozzle head projecting from the nozzle body. In practice, the layout of the overall device can contain multiple nozzle heads fed from the same reservoir, each containing its own nozzle. Alternately, multiple nozzle openings may be placed on a single nozzle head. In this exemplary design, five nozzle heads, each with a single nozzle centered on its face, are fabricated, as illustrated in FIG. 2A. The device may include a support structure which helps avoid damaging the nozzle heads during fabrication and handling; however, this support structure may cancel some of the heat transfer benefits of the nozzle head structure as well as increase the effective plane which is presented to the substrate surface, making the minimum achievable nozzle to substrate distance sensitive to discrepancies in tilt. The printhead can be fabricated without the support structure with no change to the overall process flow besides deletion of the structure from the relevant lithography step. Referring to FIG. 2A, the nozzle heads and support structure are 50 μm tall on the front side of the printhead. A single nozzle opening is centered on each of the five nozzle heads. On the back side, as shown in FIG. 2B, the reservoir is 150 μm deep and feeds into the 10 μm diameter channels that terminate in the nozzle opening on the front side.

The printhead of this example is fabricated from a <100> silicon-on-insulator (SOI) wafer with a 2 μm thick top silicon layer, 1 μm thick $SiO_2$ ("oxide") layer, and a 300 μm thick handle layer. The process may include over 120 individual steps grouped into 7 major steps, which involve defining the nozzle openings by electron beam lithography (EBL) and etching of high aspect ratio features by reactive ion etch (RIE) using the Bosch etch technique from both the front and backside. The fabrication process flow is summarized in FIGS. 6A-6E. The first step, defining the nozzle (FIG. 6A), is the only step that may require EBL, for the rest of the process lithography is performed by optical lithography. The oxide serves as an etch stop for the Bosch process and is removed by a separate dry etch process (FIG. 6D) because a wet etch results in loss of the top membrane containing the nozzle opening. The process is summarized first, and a detailed description of all process steps follows. In the following, the device layer side is referred to as the front side, and the reverse side as the back side.

Figures 6A, 6B, 6C, 6D, 6E, 6F, 6G:
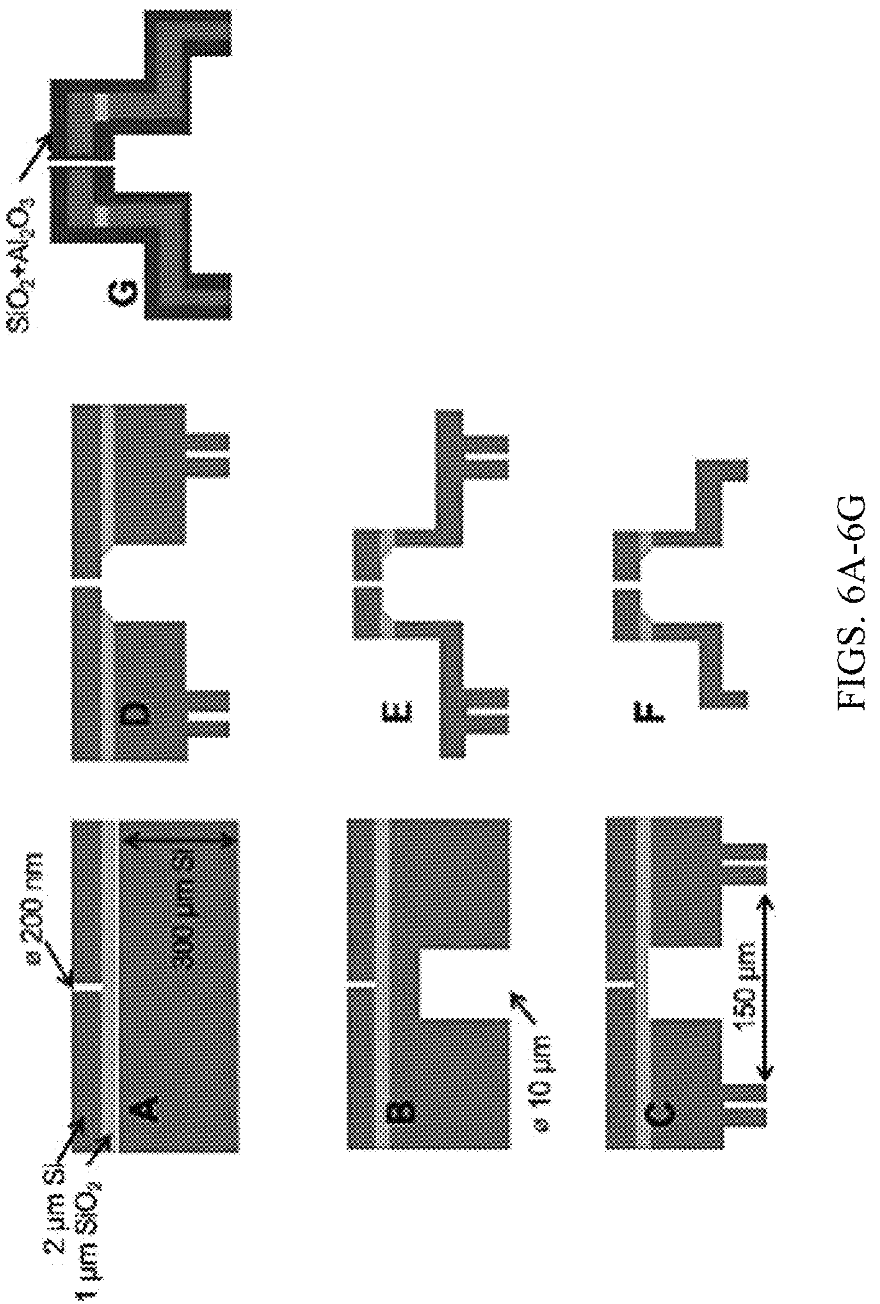
FIGS. 6A to 6G show exemplary steps in a method to fabricate the printhead.

Referring to FIG. 6A, EBL and Bosch etch are used to define nozzle and alignment marks on the frontside of the wafer. As shown in FIG. 6B, optical lithography and Bosch etch are used on the backside to start the channel. Optical lithography and Bosch etch are used on the backside to define reservoir and cleave lines while further etching the channel to touchdown on the oxide layer, as illustrated in FIG. 6C. FIG. 6D shows the oxide etch by RIE from the backside to remove oxide from the nozzle opening. Optical lithography and Bosch etch carve through the top silicon layer, RIE is used to etch through the oxide layer, and the final Bosch etch defines the nozzle head structure, as shown in FIG. 6E. Manual die singulation along etched cleave lines is illustrated in FIG. 6F, and nozzle diameter trimming by conformal deposition of materials (e.g., PECVD $SiO_2$ and ALD $Al_2O_3$) is shown in FIG. 6G.

The process is now described in more detail. Nozzle openings and wafer alignment marks are first defined on the front side by EBL. They are then etched by a Bosch etch, which terminates on the $SiO_2$ layer, as shown in FIG. 6A. The $SiO_2$ layer serves as an etch stop since the Bosch etch is highly selective (up to >100:1) in etching Si over $SiO_2$. This Bosch etch is optimized to leave a smooth scalloped surface (undulation less than 50 nm) on the etched walls. This preserves the as-patterned nozzle dimensions. This method allows for the creation of nozzle openings down to 100 nm in diameter and with a depth that is equal to the top silicon layer thickness of the SOI wafer.

Next, the channels (or TSVs) are patterned in 12 μm thick AZ4620 resist by optical lithography on the backside, and they are aligned with the nozzle openings by backside alignment to the alignment marks which were defined during the first step. The 10 μm diameter TSVs are etched by a Bosch etch to a depth of 200 μm, as shown in FIG. 6B. This etch does not touch down to the oxide because these openings will also be exposed during the subsequent reservoir etch. The depth of the channel is optimized such that the channel will touch down on the $SiO_2$ layer during the subsequent etch that defines the 150 μm deep reservoir.

To form the reservoir, 8 μm thick AZ4620 resist is patterned by optical lithography with 150 μm by 150 μm squares on the backside overlapping the channels and Bosch etched down 150 μm. The channel etch continues during this step, resulting in touchdown on the oxide layer. Cleaving lines between individual dies are also patterned and etched during this step (FIG. 6C). Once the channels have landed on oxide, the oxide is also etched from the backside by RIE to open the nozzle to the channel (FIG. 6D).

The shaping of the nozzle head structure is performed at the end to reduce risk of breakage during fabrication. The 30 μm diameter circular head is patterned on the frontside of the wafer in 8 μm thick AZ4620 resist by optical lithography. This pattern is prone to lift off during development since there are a lot of edges relative to overall surface area, so poly(methyl methacrylate) (PMMA) is used underneath the AZ4620 to promote adhesion. A Bosch etch is performed to etch through the 2 μm thick top silicon, followed by RIE to etch through the 2 μm $SiO_2$ layer. Lastly, a Bosch etch is used to etch the remaining 47 μm, resulting in a 50 μm tall pillar that contains the nozzle opening (FIG. 6E).

At this point in the process, all etches are complete and the membranes holding individual dies together on the wafer are only 75 μm thick along the cleaving lines and 175 μm thick elsewhere, so the dies separate when manual pressure is applied (FIG. 6F).

Figures 1, 2, 3, 7A, 7B, 7C:
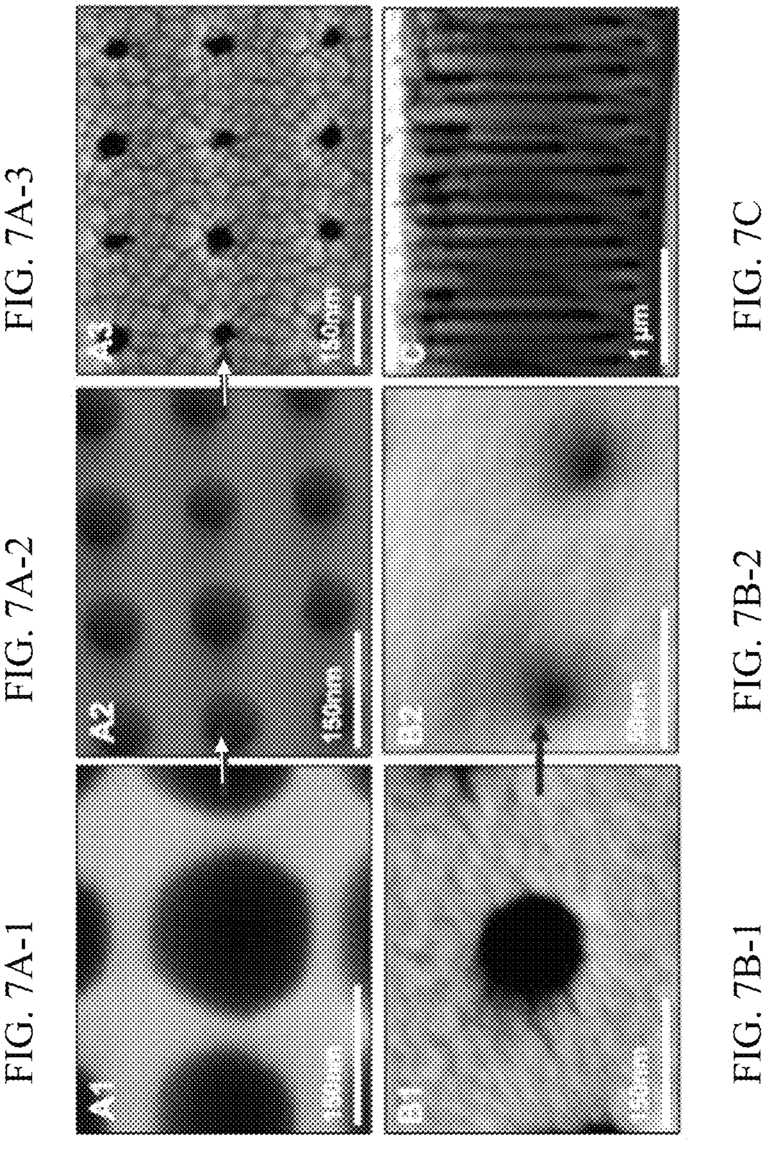

The resist thickness required to survive the Bosch etch through the 2 μm thick top silicon layer which defines the nozzle opening limits the smallest nozzle size defined by EBL to around 100 nm, so alternative methods may be required to further reduce the nozzle diameter. To this end, an additional process has been developed for further narrowing the nozzle opening by performing a plasma enhanced chemical vapor deposition (PECVD) necking and atomic layer deposition (ALD) trim, as shown in FIG. 6G. These processes lead to deposition along the perimeter of the nozzle opening, leading to further narrowing. FIG. 7A shows an array of test nozzles on a blank wafer which have been reduced from 150 nm (FIG. 7A-1) to 80 nm diameter (FIG. 7A-2) by depositing 80 nm (surface film thickness) $SiO_2$ by PECVD, then further reduced to 30 nm (FIG. 7A-3) by depositing 20 nm $Al_2O_3$ by ALD. The PECVD deposited material is not perfectly conformal to the nozzle sidewalls, so depositing 80 nm film thickness on the surface results in ~35 nm thickness of material deposited on the nozzle sidewalls. The $SiO_2$ coverage is maximal in the downstream end of the nozzle opening and tapers down deeper inside (upstream), as seen in FIG. 7C. The ALD deposition is highly conformal, so the same amount of material is deposited on the walls defining the nozzle opening as is deposited on the surface of the substrate. ALD processes may be conformal over a wide range of process conditions due to their layer-by-layer deposition, thus it is likely that the ALD coverage is uniform throughout the nozzle opening. It is demonstrated that the nozzle openings may be reduced in size solely by ALD. FIG. 7B shows an array of test nozzles which have been reduced from 147 nm diameter (FIG. 7B-1) to 26 nm diameter (FIG. 7B-2) by depositing 60 nm of $Al_2O_3$ by ALD.

Printhead Loading

The reservoir of the printhead may be manually filled with solid material and sealed by mounting the back face of the printhead to a 200 μm thick glass cover slide via indium bonding. Indium bonding has been a longstanding practice in areas such as molecular beam epitaxy where it has been used to bond substrates to substrate holders due to the low melting point of In (160° C.) and its low outgassing under vacuum. The bond is held by the surface tension of the liquid In between the mating surfaces when the substrates are heated to above the melting temperature of In.

A "black silicon" chip is mounted using low vapor pressure epoxy on the opposite side of the glass. Black silicon refers to silicon that has been etched to create a needle-like roughened surface which results increased light absorption. It is used as a heat absorber for radiative heating of the printhead and is aligned with the footprint of the printhead. In this work, the black silicon is created by a RIE process. A thermocouple is sandwiched under the black silicon chip to monitor the temperature of the black silicon. It is believed that the whole black silicon chip-printhead system is at the same temperature due to the high thermal conductivity of silicon and thin glass, so the thermocouple temperature measurement is taken to be that of the printhead.

Printhead Alignment

To set the surface of the glass slide parallel to the substrate, a four quadrant segmented photodiode is used to perform an initial positioning procedure. First, the substrate is positioned and the four-quadrant segmented photodiode sensor is aligned to be parallel to the substrate by reflecting an alignment laser from the substrate and centering that signal on the photodiode. Then, the glass slide assembly is added to the system above the substrate such that it is in front of the alignment laser, and the glass slide is aligned to the photodiode sensor by tilting the glass slide until the signal is once again centered. The glass slide is coated with gold to allow the laser to reflect back to the sensor and the glass is mounted in the system using a lens mount with three-point tilt adjustment for tilt. This alignment is performed to a measured accuracy of $10^{-3}$ rad. Thus, with a nozzle head width of 30 μm, the maximum distance of the nozzle opening from the substrate is 30 nm when the edge of the nozzle head is in contact with the substrate.

Temperature Control

To heat the device for deposition, focused light from a light-emitting diode (LED) is used to heat the black silicon described above while the temperature is monitored by the thermocouple under the black silicon. Since the glass slide is thin (~200 μm), the black silicon on top of the slide and the printhead on the bottom of the slide are assumed to be at the same temperature. Due to the low thermal conductivity of glass, heat is not expected to be conducted significantly in the plane of the glass slide, resulting in no conductive thermal interaction between printhead and the rest of the system when the printhead is not in contact with the substrate. The substrate is attached to a copper sample holder by vacuum grease and the temperature is regulated either passively using the room temperature copper as a heat sink, or by active cooling by a liquid nitrogen cold finger. The cold finger connects to the copper sample holder by a flexible piece of braided copper.

The relationship between z position and temperature is used to calibrate the position of the tip of the nozzle head relative to the surface of the substrate. The printhead is heated by a constant power from the LED while the substrate is raised and lowered to determine the position at which it makes physical contact with the nozzle head. During this touchdown procedure, the distance between the hot printhead and cold substrate is decreased (using the piezoelectric drive) until a sharp drop in temperature of the printhead is observed, which is believed to be caused by the sudden increase in thermal loss due to contact between heated nozzle head and the cold substrate. At sub-10 μm distances, the prevalence of near field radiative heat transfer (NFRHT) over blackbody radiation is known to take place and is enhanced with decreased distance, but those effects are expected to be subtle compared to the effect of contact with the substrate. The position at which the sharp drop in temperature is observed is taken to be the position of z=0, where the nozzle head tip is in contact with the surface of the substrate. The printhead to substrate distance is then set by retracting the printhead to the position using the piezoelectric drive. The printhead to substrate distance is verified by analysis of the deposition profiles ex-situ.

Deposition Experiments

Fixed Deposition

The performance of the printhead was tested using low vapor pressure evaporants such as coumarin-6 ("coumarin"), perylenetetracarboxylic dianhydride (PTCDA), and zinc. These materials were chosen for the preliminary proof of concept experiments due to their low evaporation temperatures, air stability, and low toxicity. PTCDA and coumarin were deposited on bare Si <100> substrates, while zinc was deposited on S <100> with a 7 nm Cr/150 nm Au adhesion layer deposited by electron beam physical vapor deposition. Representative static (i.e., scanning stage held at constant x-y-z position) depositions of PTCDA, zinc, and coumarin are shown in FIGS. 8A-8D. These materials have been vacuum evaporated for thin film deposition in other work and have vapor pressures greater than 0.1 Pa at temperatures less than 300° C. The highest achieved temperature for the printhead in these experiments was 300° C. and is limited by the 300 mW incident optical power of the LED currently used. Higher evaporation temperatures are possible with laser or resistive heating, with the ultimate limit being the decomposition of the silicon-based printhead. Due to this limit, as well as substrate heating caused by increased thermal coupling at high temperatures and close printhead-to-substrate distances due to NFRHT, deposition of low vapor pressure metals is more challenging. However, a large number of metals relevant to microelectronics may be deposited from the printhead using the CVD implementation described above with organometallic precursors whose transport and deposition chemistry do not require high thermal budgets.

In these experiments, the deposited spot size is taken to be an indicator of the printhead-to-substrate distance. In the deposition shown in FIG. 8A, the full width at half maximum (FWHM) measured by scanning laser confocal microscopy (SLCM) of the smallest spot is 10 μm, about 10× the nozzle opening diameter (0.8 μm), indicating a larger printhead to substrate distance compared to the deposition in FIGS. 8B and 8C, where the FWHM of the smallest spot is 1.5 μm and 1 μm respectively, less than 2× the nozzle opening diameter (0.9 μm). The deposition shown in FIG. 8C can be viewed as a benchmark, suggesting that depositions from a nozzle in this system can be similar in size to the nozzle from which they are deposited. This leads to the reasoning that shrinking the nozzle opening diameters farther could result in depositions with nanoscale feature size. The zinc deposition in FIG. 8C has one spot which is much larger than the others, which was caused by damage to the top membrane of the nozzle head during handling, resulting in the 10 μm TSV (channel) opening depositing directly on the substrate.

Figures 8A, 8B, 8C, 8D:
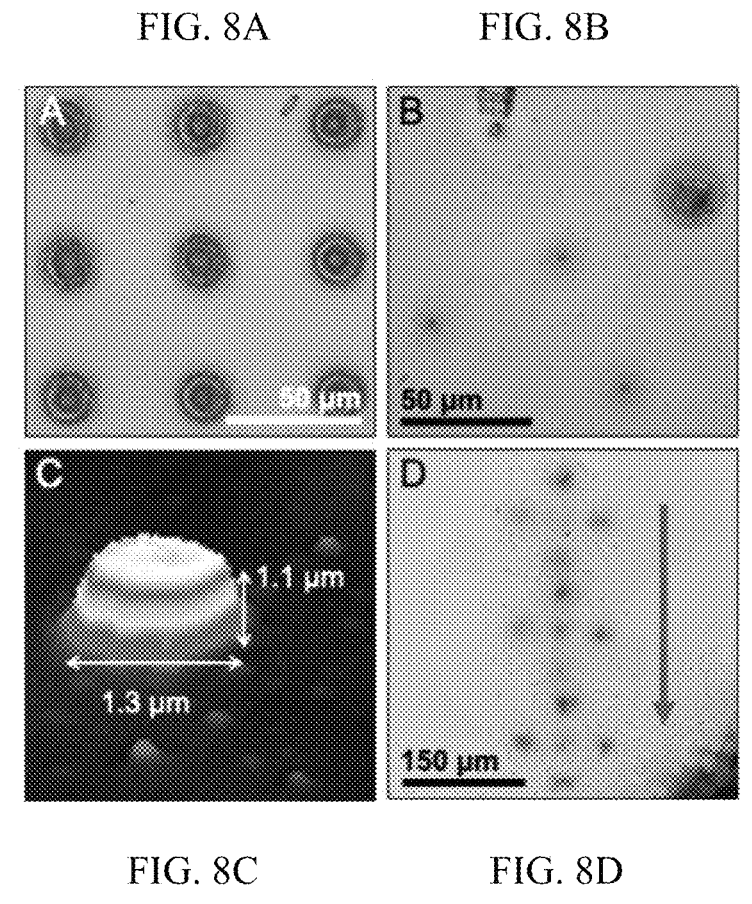

A step-and-repeat deposition of coumarin is shown in FIG. 8D, where the printheads were stepped along the direction of the arrow in 150 μm steps without recalibrating the source to substrate distance. The deposited spots become slightly more diffuse and spread out as the printhead moves along the surface. This is likely due to angular mismatch between the surface of the substrate and the horizontal translation axis, thus causing a variation in source to substrate distance between the different depositions. At the upper part of the image, the nozzles are farther away from the substrate, resulting in the slight broadening of the deposition features. The differences are not believed to be due to nozzle clogging because the nozzle is hot, and because the same nozzle has been used repeatedly to deposit over weeks with no evidence of clogging.

Preliminary statistics were obtained on the variation of the deposited spot size from depositions from 0.8 μm diameter nozzle openings and intended 500 nm source to substrate distance. Analysis of 25 Coumarin deposition spots from five separate deposition trials from devices containing five nozzles each yielded an average spot size of 1.3 μm with 0.5 μm standard deviation. Variations can arise due to varying nozzle opening diameter, and source to substrate distance. It is believed that the source to substrate distance is a key contributor to the variability, and that it may be improved by continuously adjusting the source to substrate distance during deposition by implementing a closed loop feedback control using a sensitive technique such as NFRHT. The radiative thermal losses of the heated printhead should vary with distance in the near field since NFRHT, in contrast to blackbody radiation, is a function of the distance between the two objects. The dependence of NFRHT on the distance, d, depends on the geometry of the two objects and scales as $I/d^2$ between parallel plates such as the nozzle head/substrate system presented in this paper.

Writing of Lines

Figures 9A, 9B, 9C:
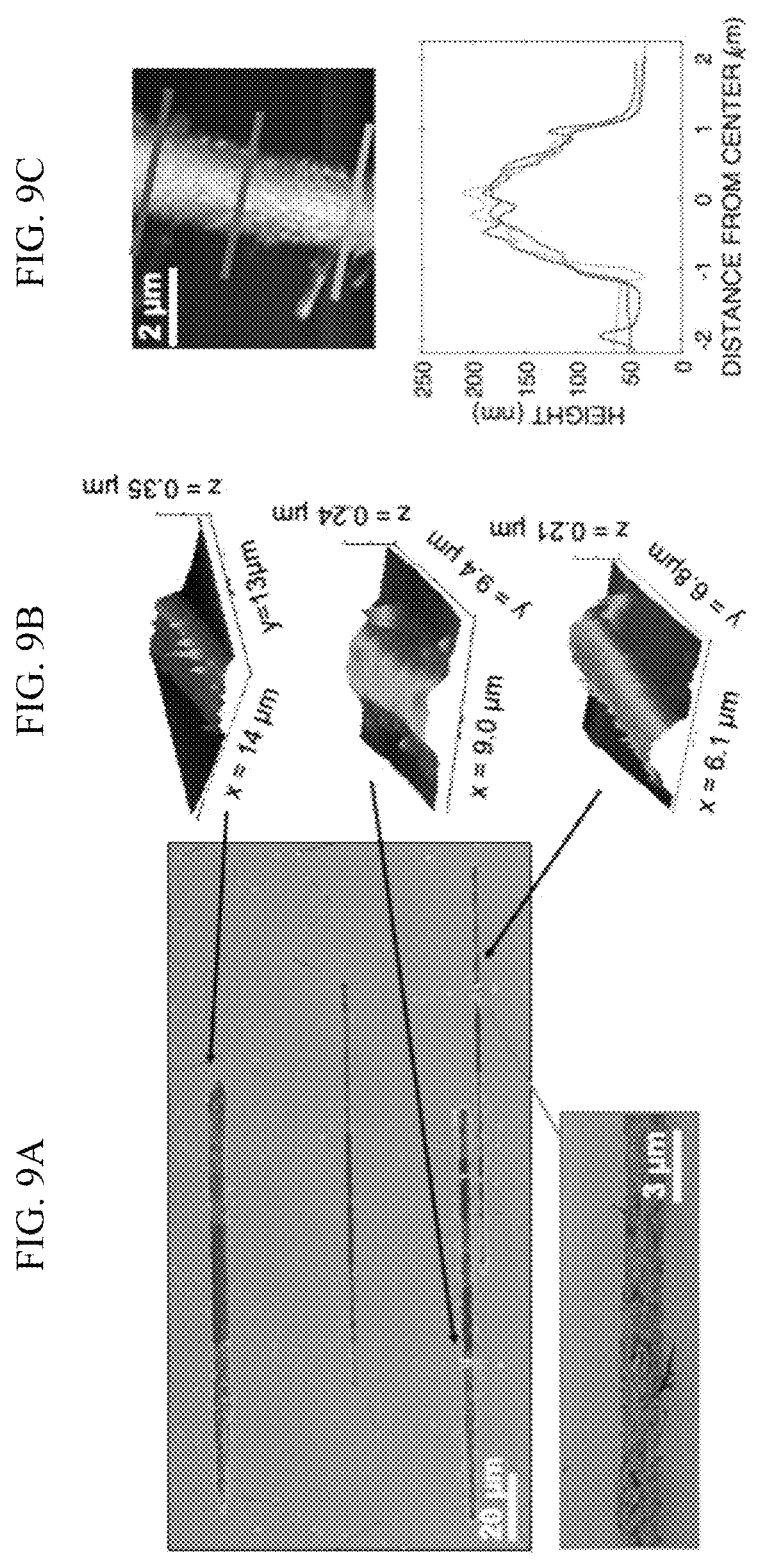

Lines were written with coumarin, evaporated at 160° C., as shown in FIG. 9A. In Initial contact with the substrate surface was determined by thermal touchdown, as described above, and then the printhead to substrate distance was increased by 500 nm for deposition. Lines were written with a translation speed of 5 nm/s. Variation in linewidths between the different lines in FIG. 9A occurs due to variation in nozzle opening diameters that arises from the PECVD/ALD nozzle trimming process described above. The linewidths were between 2 μm and 8 μm, and the thicknesses of the lines ranged from ~200 nm to 300 nm.

In contrast to the large cross-sectional variation between lines from different nozzle openings, as shown in the images of FIG. 9B, the cross-sectional profiles are fairly uniform along the length of each individual line, as observed visually in FIG. 9A and in cross sectional view over a representative line segment in FIG. 9C. Some variations in profile along the lines appear to be caused by acicular grain patterns of the coumarin crystals within the line, which can be seen on the inset of FIG. 9A. Selective exposure to the SEM beam during higher magnification imaging of some sections of the lines caused such sections to appear darker in the image due to charge accumulation in the nonconductive material and is an artifact. The lines were written in the right to left direction, and the taper on the left side is due in part to angular mismatch between the substrate surface and translation axis, and is not believed to be due to nozzle clogging.

The dependence of deposition width on printhead to substrate distance can be used to check that the printhead to substrate distance was below a certain threshold and/or held constant during writing lines.

Deposition Profile Analysis

Figures 10A, 10B:
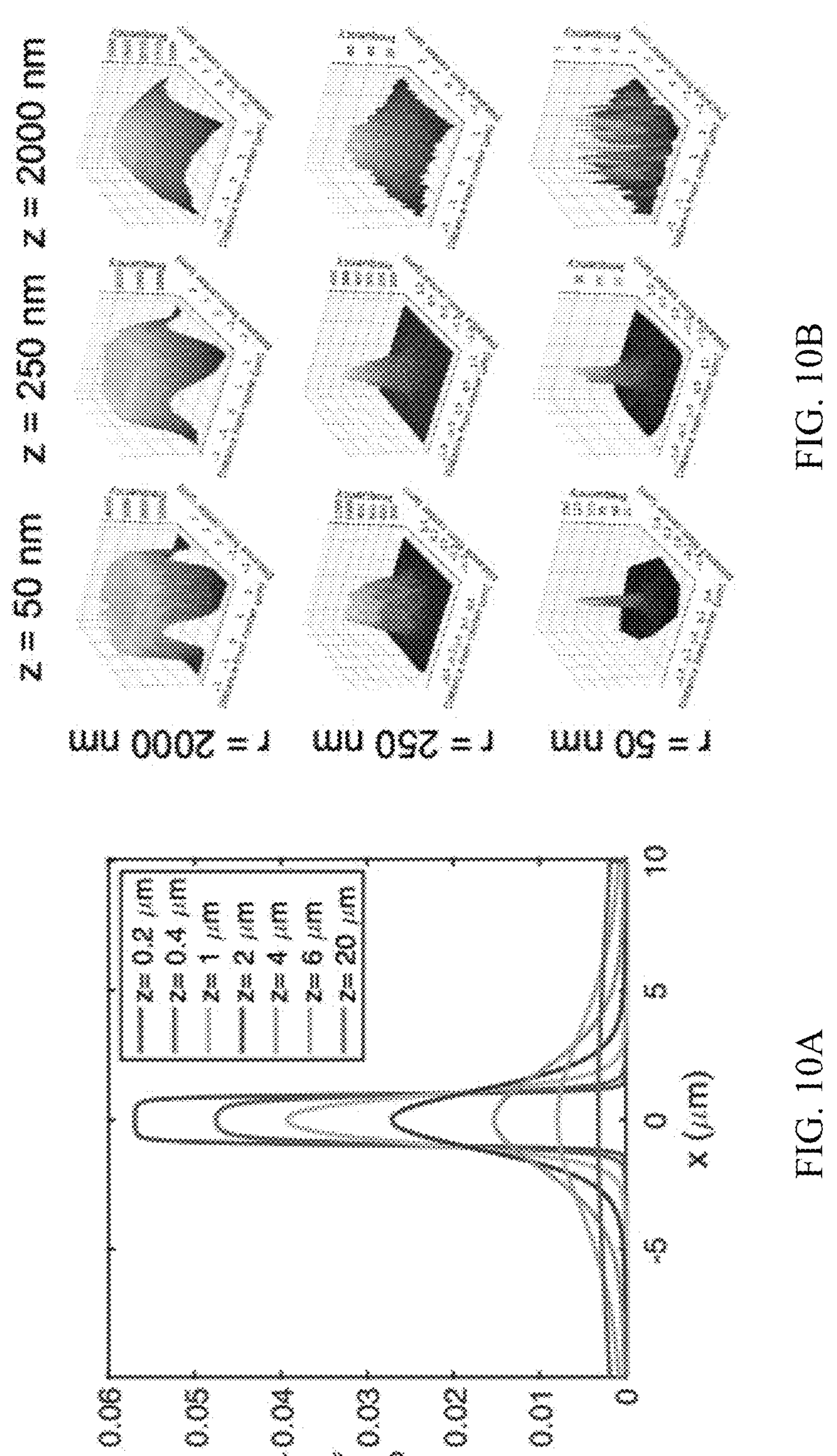
FIG. 10A shows height profiles for r=1000 nm plotted from calculation by adaptation of cosine distribution law
FIG. 10B shows height profiles plotted from direct simulation Monte Carlo (DSMC) simulations for nozzle opening radius r=50 nm, 250 nm, and 2000 nm and source to substrate distance z=50 nm, 250 nm, and 2000 nm.

Calculations utilizing Knudsen's cosine distribution law (with appropriate adaptations for the source size, since the nozzle opening is not a point source, and height of the accumulated deposition) were performed numerically in MATLAB using a two-dimensional model. The resultant profiles from a 2 μm diameter nozzle are shown in FIG. 10A. A flat top shape begins to occur upon lowering to z positions $z \ll r$, as can be seen by the z=0.2 μm line, where r represents the radius of the nozzle opening. The deposition profile becomes flat on the top as the printhead approaches contact with the substrate, an extreme which would result in a perfectly flat deposition inside the nozzle opening with vertical sidewalls and no deposition outside the nozzle area.

The evolution of the deposition profile with source to substrate distance during deposition was further studied using DSMC simulations performed using Stochastic Parallel Rarefied-gas Time-accurate Analyzer (SPARTA). The plots in FIG. 10B show the concentration of molecular flux across the substrate surface for various values of r and z. For these plots, the atomic weight and Bohr radius corresponding to Zn were used. Simulations were also run with the molecular weight and estimated molecular diameter of Coumarin, resulting in similarly shaped depositions with a different rate of accumulation due to the larger size of the molecules. The DSMC results concur that reducing nozzle size and improving control over the source to substrate distance can lead to more localized depositions and thus improved linewidths, as shown in FIG. 10B. Regarding the qualitative shape of the deposition, DSMC simulations agree with the earlier discussed calculations based on the cosine law equation, showing that the deposition profiles begin flattening at the top as the source to substrate distance is reduced.

Figures 11A, 11B:
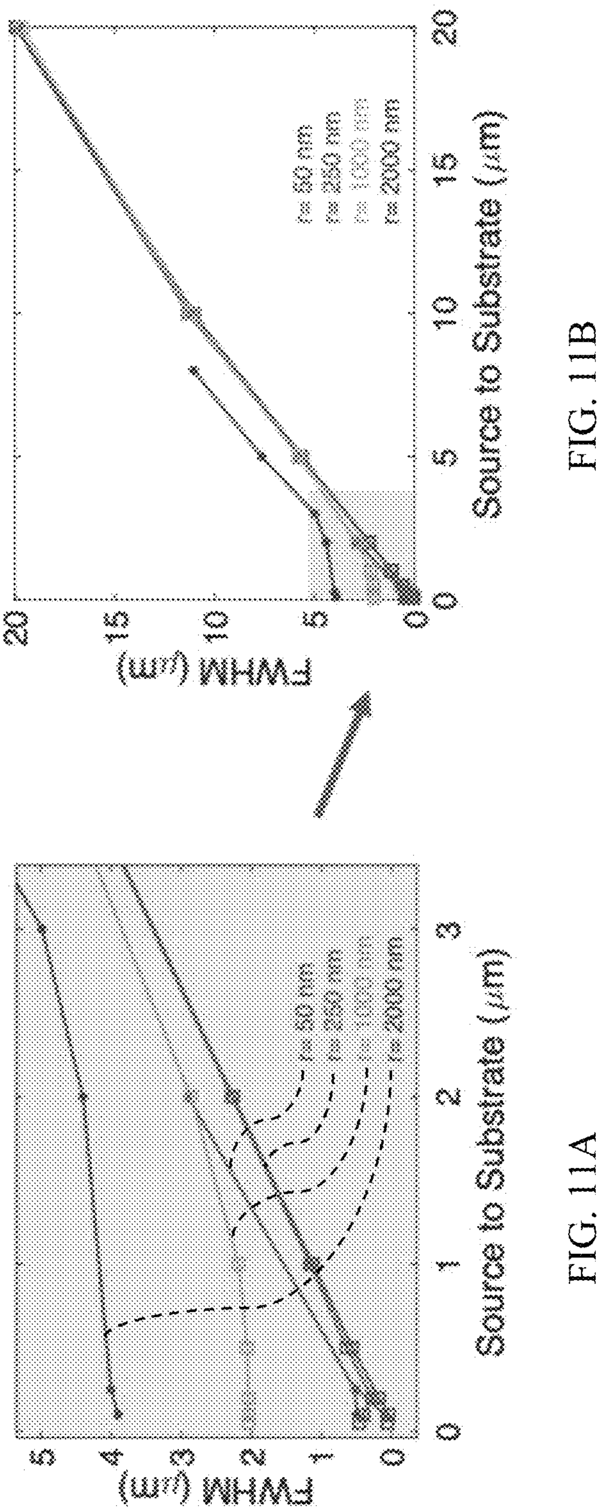
FIGS. 11A and 11B plot full width at half maximum (FWHM) of depositions versus source to substrate distance for various nozzle opening sizes.

The resulting FWHM of depositions with varying nozzle size and source to substrate distance as simulated by DSMC are plotted in FIG. 11 (closed circles) alongside the results from the previously discussed cosine distribution law analysis (open squares). At large distances, the FWHM vs source to substrate distance relationship becomes linear. At lower source to substrate distances, the plotted curve flattens as the FWHM approaches an absolute minimum (the deposition width cannot be smaller than the nozzle size). Note that, in the FWHM vs source distance graph of FIG. 11, the FWHM appears to increase at very small source to substrate distances. This is an artifact of the evolving profile shape of the deposition from rounded to increasingly flat-topped. In summary, the DSMC simulations and cosine distribution law-based results agree on a source distance vs FWHM trend which flattens out when $z<r$, and increases linearly for $z>>r$. The smallest possible spot size may be comparable to the nozzle diameter.

Depositions with both rounded and flattened tops were observed in experiment, with flattened tops appearing for smaller source to substrate distances. The measured FWHM of depositions were compared to simulations to determine an upper bound for the source to substrate distance. For example, the dot shown in FIG. 8C was deposited by a r=450 nm nozzle, resulting in a FWHM of 1.3 μm. Matching this result to the graph in FIG. 11A, a maximum source to substrate distance of 1 μm is obtained, since a r=250 nm nozzle at 1 μm will produce a FWHM>1 μm and a r=1000 nm diameter nozzle deposition has FWHM>2 μm at z=1 μm. The knowledge in FIG. 11A may also be applied to a line deposition. The line shown in FIG. 9C has a FWHM of 2 μm and is from a nozzle with r=150 nm. This nozzle falls between the r=250 nm and r=50 nm curves in FIG. 11A, both of which have z<2 μm for 2 μm FWHM. Therefore, it is reasoned that the deposition in FIG. 9C was deposited from a nozzle held a distance less than 2 μm away from the substrate. Furthermore, since this is in the linear part of the curve for both r=50 nm and r=250 nm, it is known that the linewidth should vary directly with any variation in source to substrate distance during write. If the width of the line is constant over its length, it can be concluded that the write operation was performed at a constant source-to-substrate distance along its length.

CONCLUSIONS

In this disclosure, the fabrication and use of a novel silicon-based printhead developed for direct write technology applications has been described. A process flow for the fabrication of the printhead with nozzle opening sizes down to 300 nm is demonstrated, as well as shown a route to fabricating nozzle openings as small as 30 nm. The printhead has been integrated with remote heating by LED and a piezo-driven near-field scanning stage in vacuum, and a novel way has been developed to set printhead (source)-to-substrate distance by thermal interactions for deposition onto a substrate. The capabilities of the printhead were shown by initial experiments with depositions of low temperature PVD materials, demonstrating the deposition of spots and lines with 1-10 μm widths from nozzle openings in the 300 nm to 2 μm range. Finally, using two approaches, one based upon Knudsen's cosine law, and another based upon a Monte Carlo approach, simulations have been developed for predicting the direct write deposition profiles and resolutions, and these were compared to experimental results.

The simplicity of an all-in-one device which contains both a reservoir for the material to be printed and nozzle heads may allow quick integration into any preexisting vacuum system that allows for a scanning probe and heat source. Since the exemplary printhead was fabricated from silicon, the vast library of silicon-based fabrication technologies is available for modification and development of the printhead, including narrowing of the nozzle opening diameter. The deposited feature size demonstrated in this work is already appropriate for applications in heterogeneous integration (two orders of magnitude smaller than the current state of the art for printed interconnects on organic circuit boards). Additionally, from these benchmark results, it is believed that much smaller feature sizes are possible with this system for applications in 3D direct-write chip manufacturing.

Methods

Cleanroom processing: Electron beam lithography was performed with JEOL 8100FS and optical lithography was performed with Heidelberg MLA150 Maskless Lithography. RIE etches were performed with RIE Oxford PlasmaLab 100. Black silicon was produced by etching with Plasma-Therm Versaline Deep Si RIE. PECVD deposition was performed with Oxford Plasmalab 100 Inductively Coupled Plasma Enhanced Chemical Vapor Deposition. ALD was performed with Arradiance Gemstar.

Deposition experiments: Ted Pella Micro Cover Glass 22×22 mm, No. 1 slides were coated in 7 nm Cr and 150 nm Au by Angstron EvoVac Electron Beam Evaporator. On the opposite side, an approx. 4 mm×4 mm black silicon chip (fabricated by RIE, see Methods: Black Silicon) and NiCr—Ni thermocouple (Goodfellow) were adhered with Loctite AEIC two part epoxy which was cured on a hotplate at 121° C. for 30 minutes. Loctite AEIC was chosen because it has low outgassing properties at temperatures up to 300° C. The printhead was affixed to the gold coated side of the glass slides directly opposite the black silicon chip by indium (Indium Co.) on a hotplate at 180° C. Evaporation materials were purchased from Sigma-Aldrich and used as received. The alignment system consists of a ThorLabs PL201 laser, ThorLabs PDQ80A Quadrant Detector Sensor Head, 50/50 mirror, and optomechanical parts purchased from ThorLabs. Nanopositioners ECS50×50/NUM/UHV were purchased from Attocube and attached to a custom-designed stainless steel stage which was fabricated by the University of Chicago Central Shop. A mounted LED (ThorLabs M660L4 with controller ThorLabs DC2200) was used for heating the printheads. All deposition trials were performed under vacuum in the range of $10^{-5}$ kPa to $10^{-7}$ kPa. Custom cold finger purchased from McCallister Technical Services.

Vacuum pumps used were: Kurt Lesker KJLC-RV Rotary pump, Pfeiffer TPH420 Turbo Pump, Agilent Vaclon Plus 75 Ion Pump, Vacuum pressure measured with Kurt Lesker 275 series Convection Vacuum Gauge and 392 Series Ionization Vacuum Gauge. Keithley DMM500 was used to read thermocouple for thermal measurements. Vacuum electrical feedthroughs were purchased from AccuGlass.

Characterization: To view the etch cross section, the printheads were FIB milled and imaged by FEI Nova 600 NanoLab. The depositions were imaged by either FEI Nova 600 NanoLab or Carl Zeiss Merlin SEM, and 3D laser confocal measurements were performed using Olympus OLS5000 LEXT. Height measurements of the depositions were also performed with Bruker Multimode 5 AFM.

While various embodiments have been described, it will be apparent to those of ordinary skill in the art that many more embodiments and implementations are possible. Accordingly, the embodiments described herein are examples, not the only possible embodiments and implementations.

In addition to the features mentioned in each of the independent aspects enumerated above, some examples may show, alone or in combination, the optional features mentioned in the dependent aspects and/or as disclosed in the description above and shown in the figures.

What is claimed is:

1. A printhead for direct write vapor deposition, the printhead comprising:

a nozzle body including a reservoir for holding a material to be printed; and a nozzle head protruding from the nozzle body and including a nozzle opening for ejection of the material as a vapor-phase ink, the nozzle opening being in fluid communication with the reservoir, wherein the nozzle head protrudes from the nozzle body a distance of at least 10 microns and as high as 500 microns.

2. The printhead of claim 1, wherein the nozzle opening has a width or diameter in a range from 30 nm to 100 microns.

3. The printhead of claim 1 being fabricated from a semiconductor wafer.

4. The printhead of claim 1, wherein a channel extends between the reservoir and the nozzle opening for flow of the vapor-phase ink, the channel having a width or diameter smaller than that of the reservoir and larger than that of the nozzle opening.

5. The printhead of claim 1, wherein a width or diameter of the reservoir is in a range from about 100 microns to about 5000 microns.

6. The printhead of claim 1 further comprising:

a plurality of the nozzle heads and the nozzle openings.

7. The printhead of claim 6 further comprising:

a plurality of the reservoirs.

8. The printhead of claim 7, wherein each of the reservoirs is in fluid communication with one of the nozzle openings.

9. The printhead of claim 7, wherein each of the reservoirs is in fluid communication with more than one of the nozzle openings.

10. The printhead of claim 1, wherein the printhead is fabricated from a silicon-on-insulator (SOI) wafer.

11. The printhead of claim 4, wherein the nozzle head includes:

a first wall portion defining the nozzle opening, the first wall portion comprising a first patterned silicon layer aligned substantially normal to the nozzle opening;

a second wall portion defining a terminating part of the channel, the second wall portion comprising a second patterned silicon layer aligned substantially normal to the channel;

and a third wall portion at a transition region between the first and second wall portions, the third wall portion comprising a patterned silicon dioxide layer between the first and second patterned silicon layers.

12. A system for direct write vapor deposition, the system comprising:

a printhead comprising:

a nozzle body including a reservoir for holding a material to be printed; and a nozzle head protruding from the nozzle body and including a nozzle opening for ejection of the material as a vapor-phase ink, the nozzle opening being in fluid communication with the reservoir;

a heat source positioned to heat the printhead;

a substrate in opposition to the nozzle opening for deposition of the vapor-phase ink; and an x-y-z motion stage configured to move the substrate relative to the printhead, wherein the system is enclosed in a vacuum chamber for operation.

13. The system of claim 12, further comprising:

a tilt stage configured to align the nozzle opening with the substrate.

14. The system of claim 12, wherein a distance between the substrate and the nozzle opening is within +/−30% of a width or diameter of the nozzle opening.

15. The system of claim 12, wherein the printhead further comprises an inlet to the reservoir of the nozzle body for delivery of the material to be printed into the reservoir.

16. A method for direct write vapor deposition, the method comprising:

providing a printhead comprising:

a nozzle body including a reservoir configured to hold a material to be printed; and a nozzle head protruding from the nozzle body and including a nozzle opening in fluid communication with the reservoir, the nozzle head protruding from the nozzle body a distance of at least 10 microns and as high as 500 microns, delivering the material to be printed into the reservoir;

heating the printhead to a temperature sufficient to evaporate the material or to maintain the material in a gaseous state, whereby a vapor-phase ink is formed and exits the printhead through the nozzle opening; and during the heating, moving a substrate positioned in opposition to the nozzle opening relative to the printhead, the vapor-phase ink contacting the substrate after exiting the printhead and being deposited as a solid material in a pattern determined by the relative motion of the printhead and the substrate.

17. The method of claim 16, wherein the material to be printed comprises a solid-phase, liquid-phase, or gas-phase material or precursor.

18. The method of claim 16, further comprising:

cooling the substrate, wherein the vapor-phase ink condenses upon contacting the substrate.

19. The method of claim 16, further comprising:

heating the substrate, wherein the vapor-phase ink chemically reacts and/or decomposes upon contacting the substrate.

20. The method of claim 16, wherein the material to be printed is continuously delivered into the reservoir during heating via an inlet to the nozzle body.

21. The method of claim 16, wherein the heating is carried out in a vacuum or an inert gas environment; or wherein the heating is carried out in a reactive environment including a gaseous reactant selected to chemically react with the vapor-phase ink upon ejection from the nozzle opening.

* * * * *